(12) United States Patent
Sato

(10) Patent No.: US 6,320,423 B1
(45) Date of Patent: Nov. 20, 2001

(54) MOS LOGIC CIRCUIT AND SEMICONDUCTOR APPARATUS INCLUDING THE SAME

(75) Inventor: Yuichi Sato, Mie-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/597,240

(22) Filed: Jun. 20, 2000

Related U.S. Application Data

(63) Continuation of application No. 09/061,178, filed on Apr. 17, 1998.

(30) Foreign Application Priority Data

Apr. 18, 1997 (JP) .................................................. 9-102059

(51) Int. Cl.⁷ ................................................ H03K 19/094
(52) U.S. Cl. ............................. 326/119; 326/112; 326/95
(58) Field of Search ................................. 326/95, 98, 112, 326/119, 121

(56) References Cited

U.S. PATENT DOCUMENTS

| | | |
|---|---|---|
| 4,631,425 | 12/1986 | Koshimaru . |
| 5,200,907 | 4/1993 | Tran . |
| 5,399,921 | 3/1995 | Dobbelaere . |
| 5,548,231 | 8/1996 | Tran . |
| 5,821,769 | 10/1998 | Douseki . |
| 5,821,778 * | 10/1998 | Bosshart .................................. 326/95 |
| 6,009,021 * | 12/1999 | Kioi ................................ 365/189.06 |
| 6,087,893 * | 7/2000 | Oowaki et al. ....................... 327/537 |

FOREIGN PATENT DOCUMENTS

| | | |
|---|---|---|
| 0739097 | 10/1996 | (EP) . |
| 2283123 | 11/1990 | (JP) . |
| 7168874 | 7/1995 | (JP) . |
| 955652 | 2/1997 | (JP) . |

OTHER PUBLICATIONS

Kazuo Yano et al., A 3.8–ns CMOS 16×16–b Multiplier Using Complementary Pass–Transistor Logic; IEEE Journal of Solid State Circuits; vol. 25, No. 2, Apr. 1990; pp. 388–395.

Zhang, C., "Universal Logic Gate Transmission Gate Array", Electronic Engineering, vol. 57, No. 706, Oct. 1985; pp. 61–67.

Fariborz Assaderaghi; Dynamic Threshold–Voltage Mosfet (DTMOS) For Ultra–Low Voltage VLSI; IEEE Transactions on Electron Devices, vol. 44, No. 3, March 1997; pp. 414–422.

* cited by examiner

*Primary Examiner*—Michael Tokar
*Assistant Examiner*—Anh Q. Tran

(57) ABSTRACT

A MOS logic circuit includes: a pass-transistor logic circuit, including at least one first MOS transistor, for performing a predetermined logic operation to provide an output; and an amplifying circuit, including at least one second MOS transistor, for enhancing a driving capability of the output of the pass-transistor logic circuit. Each of the first MOS transistor and the second MOS transistor is a DTMOS transistor having a gate connected to an associated well in which a channel thereof is formed.

7 Claims, 7 Drawing Sheets

MOS LOGIC CIRCUIT AND SEMICONDUCTOR APPARATUS INCLUDING THE SAME

This application is a continuation of co-pending application Ser. No. 09/061,178, filed on Apr. 17, 1998, the entire contents of which is hereby incorporated by reference.

BACKGROUND OF THE INVENTION

1. Field of the Invention

The present invention relates to a metal oxide semiconductor (hereinafter, simply referred to as "MOS") logic circuit. More specifically, the present invention relates to a MOS logic circuit which has a reduced number of elements and a smaller circuit area, and may be operated with lower power consumption. The present invention further relates to a semiconductor apparatus incorporating such a MOS logic circuit.

2. Description of the Related Art

Recently, a pass-transistor logic circuit has been receiving much attention as a logic circuit. The pass-transistor logic circuit is advantageous over a complementary MOS (hereinafter, simply referred to as "CMOS") static circuit in view of its reduced number of transistors, i.e., elements, and its faster operation rate.

FIG. 8 is a circuit diagram showing an example of a conventional two-input AND (NAND) circuit which includes a pass-transistor logic circuit and a CMOS latch circuit 14. The pass-transistor logic circuit includes four NMOS (n-channel field effect MOS) transistors 11-1 to 11-4.

A two-input AND (NAND) circuit in general receives two input signals (e.g., signals A and B). However, the pass-transistor logic circuit shown in FIG. 8 requires four signals, i.e., signals A and B, and their respective inverted signals AX and BX. Each of the NMOS pass-transistors 11-1 to 11-4 passes a signal of logic "0" at a GND level, i.e., a "low" level (hereinafter, simply referred to as the "L level") without changing the voltage level of the signal. However, each of the NMOS pass-transistors 11-1 to 11-4 passes a signal of logic "1" at a VDD level (a power source voltage level), i.e., a "high" level (hereinafter, simply referred to as the "H level"), such that a voltage level of the signal is decreased by the threshold voltage level of the respective NMOS transistors 11-1 to 11-4. The CMOS latch circuit 14 is thus provided in order to recover the original "H" level and to enhance a load driving capability.

In order to pull up the "H" level to the VDD level, it is known, for example, to use a PMOS (p-channel field effect MOS) transistor as a pull-up element. FIG. 9 is a circuit diagram showing an example of such a conventional MOS logic circuit, which includes a pass-transistor logic circuit made from two NMOS transistors 11-1 and 11-2, and two PMOS transistors 12-1 and 12-2.

According to the conventional MOS logic circuit shown in FIG. 9, the NMOS transistor 11-1 is employed to perform a logic operation which is valid when an input signal is at the "H" level, while the PMOS transistor 12-1 is employed to perform a logic operation which is valid when an input signal is at the "L" level. Thus, no inverted signals are necessary.

An NMOS pass-transistor, i.e., the NMOS transistor 11-1, passes a signal at the "L" level without changing the voltage level thereof. However, with respect to a signal at the "H" level, the voltage level thereof is decreased by the threshold voltage level of the NMOS transistor 11-1. On the other hand, a PMOS pass-transistor, i.e., the PMOS transistor 12-1, passes a signal at the "H" level, while it passes a signal at the "L" level such thatthe voltage level thereof is increased by the threshold voltage level of the PMOS transistor 12-1.

Therefore, in the MOS logic circuit shown in FIG. 9, the PMOS transistor 12-2 is provided for pulling up an output of the pass-transistor logic circuit to the VDD level. Similarly, the NMOS transistor 11-2 is provided for pulling down an output of the pass-transistor logic circuit to the GND level. Referring to FIG. 9, the circuit further includes an inverter 13.

Furthermore, FIG. 10B is a circuit diagram showing a conventional logic circuit using inverted input signals. FIG. 10A is a circuit diagram showing a conventional CMOS circuit having an improved configuration over the logic circuit shown in FIG. 10B, which is realized without using inverted input signals.

As can be appreciated by comparing FIGS. 10A and 10B, the CMOS circuit shown in FIG. 10A does not require inverters 13-1 and 13-2 used in the logic circuit shown in FIG. 10B. Moreover, the inverted input signals AX and BX are not necessary in the CMOS circuit shown in FIG. 10A. As a result, the wiring area of the CMOS circuit shown in FIG. 10A is reduced. However, as described above, an output at the "H" level is decreased by the threshold voltage of each of the respective NMOS transistors 11-1 to 11-4 while an output at the "L" level is increased by the threshold voltage level of each of the respective PMOS transistors 12-1 to 12-4.

The conventional pass-transistor logic circuit shown in FIG. 8 is advantageous over a CMOS static circuit in view of its reduced number of transistors as described above. However, it has the following disadvantages.

(1) Since the pass-transistor logic circuit shown in FIG. 8 requires inverted signals, the number of signals required is doubled compared to that required in the CMOS static circuit. As a result, the number of signal lines is increased, resulting in the enlarged wiring area.

(2) The doubled number of signal lines leads to the doubled number of signal transitions (i.e., signal alternations) between the "H" and "L" levels. As a result, the amount of current required for charging and discharging the wiring capacitance is increased, resulting in an increased amount of power consumption.

(3) During a transition period where levels of positive and negative signals alternate, there may be a moment when both of the positive and negative signals are at the "H" level. In such a state, the NMOS transistor is turned on, which causes a direct current path to be produced between the VDD level and the GND level in the pass-transistor logic circuit, through which a penetrating current flows.

(4) The "H" level output from the pass-transistor logic circuit is decreased from the VDD level by the threshold voltage Vthn of the NMOS transistor. When this voltage VDD−Vthn is applied to a gate of a PMOS transistor of the CMOS latch circuit 14 where the threshold voltage Vthp of the PMOS transistor is such that Vthn>|Vthp|, the PMOS transistor turns on so that the voltage VDD−Vthn is applied to a gate of the NMOS transistor. As a result, a penetrating current flows between the VDD level and the GND level via the NMOS transistor in the ON state, until the CMOS latch circuit 14 is inverted.

Furthermore, the logic circuit shown in FIG. 9 has disadvantages regarding a penetrating current flowing through the circuit whenever the level of output alternates. This is due to the following reason.

As described above, the CMOS latch 12, i.e., the PMOS transistor 12-2 and the NMOS transistor 11-2, is provided in order to increase the potential at the "H" level of the output Y1 to the VDD level, and to decrease the potential at the "L" level of the output Y1 to the GND level. Under such a situation, in the case where the NMOS transistor 11-1 is turned on and signal B at the "H" level is supplied as the output Y1, the "H" level is decreased by the threshold voltage level of the NMOS transistor 11-1. A potential of the output Y1 is determined based on a ratio of the "H" level derived from the signal B through the NMOS transistor 11-1 and the "L" level derived from the GND level through the turned-on NMOS transistor 11-2. Therefore, the impedance of the NMOS transistor 11-2 is set at such a high level that the potential of the output Y1 is higher than the inverting voltage of the inverter 13 of the CMOS latch 12 when the signal B at the "H" level is supplied as the output Y1 by the turned-on NMOS transistor 11-1.

Thus, when the potential of the output Y1 at the "H" level exceeds the inverting voltage of the inverter 13, the output Y2 of the inverter 13 becomes at the "L" level. When the output Y2 becomes at the "L" level, the NMOS transistor 11-2 is turned off while the PMOS transistor 12-2 is turned on. Since the NMOS transistor 11-2 is turned off, a direct current path running from a point, where the signal B is input, to the GND level via the NMOS transistor 11-1 and the NMOS transistor 11-2 is blocked, whereby no penetrating current flows therethrough. On the other hand, since the PMOS transistor 12-2 is turned on, the "H" level of the output Y1 is increased to the VDD level.

When the PMOS transistor 12-1 is turned on and the signal A at the "L" level is provided as the output Y1, the "L" level is increased from the GND level by the threshold voltage of the PMOS transistor 12-1. The potential of the output Y1 is determined based on a ratio of the "L" level derived from the GND level through the PMOS transistor 12-1 and the "H" level derived from the VDD level through the PMOS transistor 12-2. Therefore, the impedance of the PMOS transistor 12-2 is set at such a high level that the potential of the output Y1 is lower than the inverting voltage of the inverter 13 of the CMOS latch 12 when the signal A at the "L" level is supplied as the output Y1 by the turned-on PMOS transistor 12-1. Thus, when the output Y1 alternates from the "H" level to the "L" level, and the potential of the output Y1 becomes lower than the inverting voltage of the inverter 13, the output Y2 from the inverter 13 inverts to the "H" level. When the output Y2 becomes at the "H" level, the PMOS transistor 12-2 is turned off while the NMOS transistor 11-2 is turned on. Since the PMOS transistor 12-2 is turned off, a direct current path running from the GND level to the VDD level via the PMOS transistor 12-1 and the PMOS transistor 12-2 is blocked, whereby no penetrating current flows therethrough. Since the NMOS transistor 11-2 is turned on, the "L" level of the output Y2 is pulled down to the GND level. However, both of the NMOS and PMOS transistors of the inverter 13 remain in the ON state until the inverter 13 is inverted, whereby a penetrating current flows between the VDD level and the GND level via the inverter 13.

Thus, the logic circuit shown in FIG. 9 has a problem of a penetrating current flowing therethrough as described above.

Recently, a technology for reducing power consumption of LSIs (Large Scale Integrated circuits) is receiving attention. In order to realize low power consumption, it is effective to provide circuits which can be operated at a lower voltage. The threshold voltage of the transistor needs to be low in order to allow a pass-transistor logic circuit to be operated at a low voltage.

FIG. 11 is a circuit diagram showing an exemplary logic circuit.

Herein, the threshold voltage of a NMOS transistor is assumed to be Vthn and the threshold voltage of a PMOS transistor is assumed to be Vthp. When inputs (A, B, C, AX, BX, CX) change from (1, 0, 0, 0, 1, 1) to (1, 1, 0, 0, 0, 1) in the logic circuit shown in FIG. 11, a potential of output Y1 changes from 0 V to VDD−Vthn. The voltage VDD−Vthn needs to exceed the threshold voltage Vthn of an NMOS transistor of the CMOS latch 12.

For realizing the above, the following relationship (1) needs to be satisfied:

$$VDD - Vthn > Vthn \quad (1)$$

which can be simplified as:

$$VDD > 2Vthn \quad (2)$$

According to the above relationship (2), for example, when Vthn is 0.6 V, the circuit cannot be operated with VDD of 1.2 V or less.

In the logic circuit shown in FIG. 9, the "L" level is increased by the threshold voltage Vthp of the PMOS transistor. Thus, the following relationship (3) needs to be satisfied at the same time:

$$VDD > 2Vthn, VDD > 2|Vthp| \quad (3)$$

When the number of the stacked pass-transistors is increased, the apparent threshold voltage becomes larger due to a back gate effect, and thus, the VDD level needs to be higher. Alternatively, the number of the stacked pass-transistors needs to be as small as two, so that the VDD level does not become high, resulting in the disadvantage of an increased number of amplifiers.

In order for the logic circuit to be operated with VDD=1 V so as to reduce power consumption, Vthn and |Vthp| need to be equal to or lower than about 0.3 V, considering variations in the threshold voltage Vthn. However, when the threshold voltage is as low as about 0.3 V, the amount of leakage current generated upon turning off of the transistor becomes large, which undesirably increases the amount of a penetrating current.

For the above-described reasons, it is desirable to provide a logic circuit requiring a smaller number of elements and providing a smaller circuit area, and which may be operated with lower power consumption.

SUMMARY OF THE INVENTION

The MOS logic circuit of the present invention includes: a pass-transistor logic circuit, including at least one first MOS transistor, for performing a predetermined logic operation to provide an output; and an amplifying circuit, including at least one second MOS transistor, for enhancing a driving capability of the output of the pass-transistor logic circuit. Each of the first MOS transistor and the second MOS transistor is a DTMOS transistor having a gate connected to an associated well in which a channel thereof is formed.

The first MOS transistor may be an N-type DTMOS transistor, or a P-type DTMOS transistor.

Alternatively, the first MOS transistor may include a first N-type DTMOS transistor and a first P-type DTMOS transistor, and the second MOS transistor may include a second N-type DTMOS transistor and a second P-type DTMOS transistor. In such a case, the first N-type DTMOS transistor is employed in the logic operation of the pass-transistor logic circuit which is valid with respect to a signal of a high level, and the first P-type DTMOS transistor is employed in the logic operation of the pass-transistor logic circuit which is valid with respect to a signal of a low level.

A MOS logic circuit to be provided in accordance with another aspect of the present invention includes: a pass-transistor logic circuit, including at least one first MOS transistor, for performing a predetermined logic operation to provide an output; and an amplifying circuit, including at least one second MOS transistor, for enhancing a driving capability of the output of the pass-transistor logic circuit. An absolute value of a threshold voltage of the at least one second MOS transistor is set larger than an absolute value of a threshold voltage of the at least one first MOS transistor.

The first MOS transistor may include a first NMOS transistor and a first PMOS transistor, and the second MOS transistor may include a second NMOS transistor and a second PMOS transistor. In such a case, the first NMOS transistor is employed in the logic operation of the pass-transistor logic circuit which is valid with respect to a signal of a high level, and the first PMOS transistor is employed in the logic operation of the passtransistor logic circuit which is valid with respect to a signal of a low level.

A MOS logic circuit to be provided in accordance with still another aspect of the present invention includes: a first MOS transistor for a precharge operation; a determination circuit, including a second MOS transistor, for determining a logic, based on an input signal, by either discharging or holding a charge precharged by the first MOS transistor; and an amplifying circuit, including a third MOS transistor, for amplifying an output of the determination circuit. Each of the first, second, and third MOS transistors is a DTMOS transistor having a gate connected to an associated well in which a channel thereof is formed.

A MOS logic circuit to be provided in accordance with still another aspect of the present invention includes an N-type DTMOS transistor and a P-type DTMOS transistor each having a gate connected to an associated well in which a channel thereof is formed, wherein an inverted signal is applied to the gate of each of the N-type DTMOS transistor and the P-type DTMOS transistor.

According to still another aspect of the present invention, a semiconductor apparatus including the MOS logic circuit as described above may be provided.

Thus, the invention described herein makes possible the advantages of providing: (1) a novel MOS logic circuit which can be operated with lower power consumption, and a semiconductor apparatus incorporating such a MOS logic circuit; and (2) a novel MOS logic circuit in which no stationary penetrating current flows, and a semiconductor apparatus incorporating such a MOS logic circuit.

These and other advantages of the present invention will become apparent to those skilled in the art upon reading and understanding the following detailed description with reference to the accompanying figures.

BRIEF DESCRIPTION OF THE DRAWINGS

FIG. 10A is a circuit diagram showing a conventional CMOS circuit having an improved configuration over that of a conventional CMOS circuit shown in FIG. 10B, while

DESCRIPTION OF THE PREFERRED EMBODIMENTS

Hereinafter, the present invention will be described by way of illustrative examples with reference to the accompanying drawings.

In the present specification, a MOS transistor in which a gate is connected to a well, in which a channel of the MOS transistor is provided, is referred to as a DTMOS (Dynamic Threshold MOS) transistor. In particular, an NMOS transistor in which a gate is connected to such a well is referred to as a NDTMOS transistor. Similarly, a PMOS transistor in which a gate is connected to such a well is referred to as a PDTMOS transistor.

Figure 1:
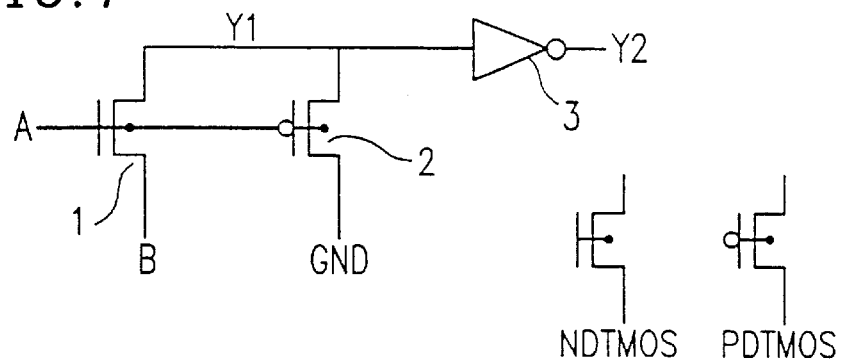
FIG. 1 is a circuit diagram showing a MOS logic circuit according to a first example of the present invention.

FIG. 1 is a circuit diagram showing a MOS logic circuit according to a first example of the present invention.

The MOS logic circuit according to the first example of the present invention is a two-input NAND circuit, which includes an NDTMOS transistor 1, a PDTMOS transistor 2 and an inverter 3. The NDTMOS transistor 1 and the PDTMOS transistor 2 form a pass-transistor logic circuit. The inverter 3 is made from a DTMOS transistor.

Two signals A and B are input to the two-input NAND circuit. Logic operations of the two-input NAND are such that output Y2 becomes at the "L" level when both of the signals A and B are at the "H" levels, and at the "H" level for other combinations of the signals A and B.

More specifically, referring to FIG. 1, when both the signals A and B are at the "H" level, the NDTMOS transistor 1 is turned on and the PDTMOS transistor 2 is turned off since the signal A is at the "H" level, whereby the "H" level of the signal B is provided as the output Y1. When the signal A is at the "H" level while the signal B is at the "L" level, the NDTMOS transistor 1 is turned on and the PDTMOS transistor 2 is turned off, whereby the "L" level of the signal B is provided as the output Y1. Moreover, when the signal A is at the "L" level, the NDTMOS transistor 1 is turned off and the PDTMOS transistor 2 is turned on, whereby the "L" level is provided as the output Y1 regardless of the level of the signal B. An inverted signal of the output Y1 (i.e., /Y1) is provided as the output Y2 from the inverter 3.

The MOS transistors used in the first example of the present invention, i.e., the NDTMOS transistor 1 and the PDTMOS transistor 2, are DTMOS transistors which have the threshold voltage characteristic such that the threshold voltage thereof becomes lower when they are in the ON state, and becomes higher when they are in the OFF state.

The DTMOS transistor is realized by short-circuiting a gate thereof and a well in which a channel thereof (also referred to as the "associated well") is disposed. For example, when a MOS transistor having a threshold voltage of about 0.4 V is formed such that its gate and the associated well are short-circuited, the threshold voltage decreases to about 0.2 V when the MOS transistor is on, while the threshold voltage is about 0.4 V when the MOS transistor is off. In this case, a circuit may be operated with a low voltage such as a VDD level of about 0.6 V.

The DTMOS transistor is applicable to both NMOS and PMOS transistors. By employing a DTMOS transistor, the threshold voltage in the ON state becomes lower, and there is no increase of an apparent threshold voltage which may be caused due to a back gate effect. Therefore, the number of stacked pass-transistors is less limited, and thus, the number of amplifiers can be reduced.

When the output from the NDTMOS transistor 1 of the pass-transistor logic circuit is at the "H" level, the output Y1 becomes VDD−Vthnon where Vthnon is the threshold voltage of the NDTMOS transistor 1 when it is in the ON state. According to the first example of the present invention, the inverter 3 as an amplifier is also made from a DTMOS transistor, and thus, it is possible to realize a relationship |Vthpoff|>Vthnon, where Vthpoff is the threshold voltage of the PDTMOS transistor 2 when it is in the OFF state. As a result, no stationary penetrating current flows through the inverter 3, which makes a PMOS transistor for pulling up the "H" level unnecessary.

On the other hand, when the output from the NDTMOS transistor 1 of the pass-transistor logic is at the "L" level, the output Y1 becomes GND−Vthpon, where Vthpon is the threshold voltage of the PDTMOS transistor 2 when it is in the ON state. According to the first example of the present invention, the inverter 3 as the amplifier is also made from a DTMOS transistor, and thus, it is possible to realize a relationship Vthnoff>|Vthpon|, where Vthnoff is the threshold voltage of the NDTMOS transistor 1 when it is in the OFF state. As a result, no stationary penetrating current flows through the inverter 3, which makes a NMOS transistor for pulling down the "L" level unnecessary.

In addition, since the threshold voltage of the DTMOS transistor in the OFF state is greater than that in the ON state, the amount of an OFF leakage current is small. Therefore, the amount of a penetrating current generated in the pass-transistor logic circuit is very small.

Thus, in the MOS logic circuit according to the first example of the present invention, the number of elements and the number of signal lines are both reduced, and therefore, the circuit area and the wiring area are also reduced. Moreover, the MOS logic circuit according to the first example of the present invention is operated with a low power consumption.

Figure 2:
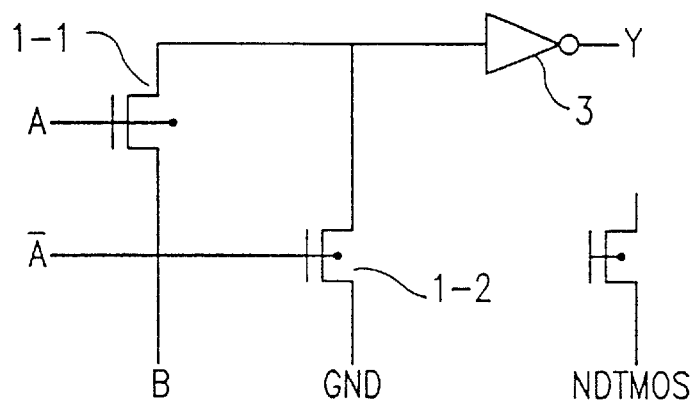
FIG. 2 is a circuit diagram showing a MOS logic circuit according to a second example of the present invention.

FIG. 2 is a circuit diagram showing a MOS logic circuit according to a second example of the present invention.

A pass-transistor logic circuit according to the second example of the present invention includes only NDTMOS transistors. Specifically, the MOS logic circuit according to the second example of the present invention includes NDTMOS transistors 1-1 and 1-2 as the passtransistor logic circuit, and an inverter 3. The inverter 3 is made from an NDTMOS transistor and amplifies an output of the pass-transistor logic circuit to enhance a driving capability thereof.

The pass-transistor logic circuit according to the second example of the present invention performs logic operations to provide an output in substantially the same manner as the pass-transistor logic circuit according to the first example of the present invention, except that three input signals, A, $\overline{A}$ and B are used.

As in the first example of the present invention, in the MOS logic circuit according to the second example of the present invention, a PMOS transistor for pulling up the "H" level or an NMOS transistor for pulling down the "L" level, required conventionally, is not necessary. As a result, the MOS logic circuit according to the second example of the present invention requires a smaller number of elements and a smaller circuit area, and may be operated with lower power consumption.

Figure 3:
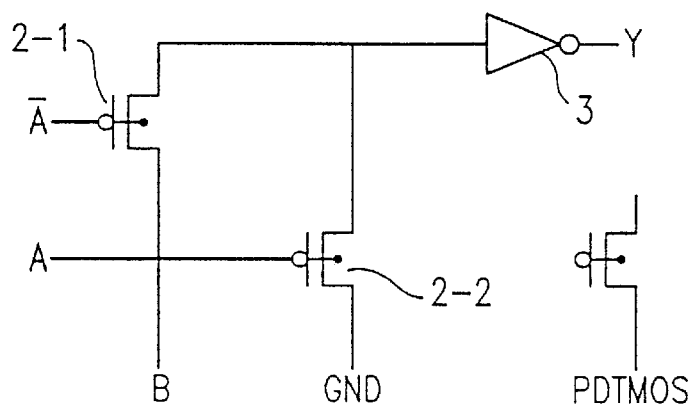
FIG. 3 is a circuit diagram showing a MOS logic circuit according to a third example of the present invention.

FIG. 3 is a circuit diagram showing a MOS logic circuit according to a third example of the present invention.

A pass-transistor logic circuit according to the third example of the present invention includes only PDTMOS transistors. Specifically, the MOS logic circuit according to the third example of the present invention includes PDTMOS transistors 2-1 and 2-2 as the pass-transistor logic circuit, and an inverter 3. The inverter 3 is made from a PDTMOS transistor and amplifies an output of the pass-transistor logic circuit to enhance a driving capability thereof.

The pass-transistor logic circuit according to the third example of the present invention performs logic operations to provide an output in substantially the same manner as the pass-transistor logic circuit according to the first example of the present invention, except that three input signals, $\overline{A}$, A and B are used.

As in the first example of the present invention, in the MOS logic circuit according to the third example of the present invention, a PMOS transistor for pulling up the "H" level or an NMOS transistor for pulling down the "L" level, required conventionally, is not necessary. As a result, the MOS logic circuit according to the third example of the present invention requires a smaller number of elements and a smaller circuit area, and may be operated with lower power consumption.

Figure 4:
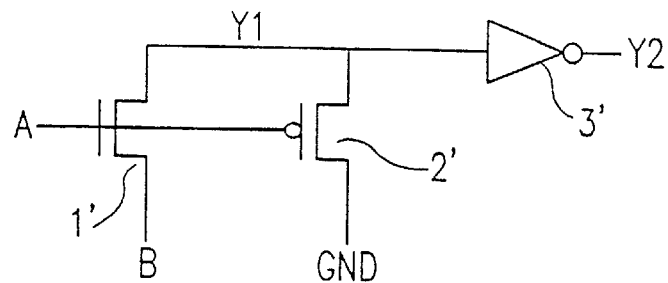
FIG. 4 is a circuit diagram showing a MOS logic circuit according to a fourth example of the present invention.

FIG. 4 is a circuit diagram showing a MOS logic circuit according to a fourth example of the present invention.

The MOS logic circuit according to the fourth example of the present invention includes an NMOS transistor 1' and a PMOS transistor 2' as a pass-transistor logic circuit, and an inverter 3'. The inverter 3' is made from NMOS and PMOS transistors and amplifies an output of the pass-transistor logic circuit to enhance a driving capability thereof. Furthermore, two signals A and B are input to the pass-transistor logic circuit, and an output Y1 is obtained based on logic operations which are performed in substantially the same manner as in the first example of the present invention.

According to the fourth example of the present invention, each of the threshold voltages of the NMOS and PMOS transistors of the inverter 3' as an amplifier is set so as to be higher than each of the threshold voltages of the NMOS transistor 1' and the PMOS transistor 2'.

Hereinafter, operation of the MOS logic circuit according to the fourth example of the present invention will be described.

Referring to FIG. 4, when the "H" level which is lower than the VDD level by the threshold voltage Vthn1' of the NMOS transistor 1' is provided as the output Y1, the potential of the output Y1 becomes VDD−Vthn1'. A relationship between the threshold voltage Vthp3' of the PMOS transistor of the inverter 3' and the threshold voltage Vthn1' of the NMOS transistor 1' is |Vthp3'|>Vthn1', and thus, the PMOS transistor of the inverter 3' is not turned on by the potential of VDD−Vthn1' of the output Y1, and only the NMOS transistor of the inverter 3' is turned on. As a result, in the MOS logic circuit according to the fourth example of the present invention, no stationary penetrating current flows through the inverter 3' even without employing a pull-up PMOS transistor.

Furthermore, in the case where the "L" level which is higher than the GND level by the threshold voltage Vthp2' of the PMOS transistor 2' is provided as the output Y1, a relationship between the threshold voltage Vthn3' of the NMOS transistor of the inverter 3' and the threshold voltage Vthp2' of the PMOS transistor 2' is |Vthn3'|>Vthp2', and thus, the NMOS transistor of the inverter 3' is not turned on by the potential 0−Vthn2' of the output Y1, and only the PMOS transistor of the inverter 3' is turned on. As a result, in the MOS logic circuit according to the fourth example of the present invention, no stationary penetrating current flows through the inverter 3' even without employing a pulldown NMOS transistor.

Thus, the MOS logic circuit according to the fourth example of the present invention has a smaller number of elements and has a smaller circuit area, and may be operated with lower power consumption.

Figure 5:
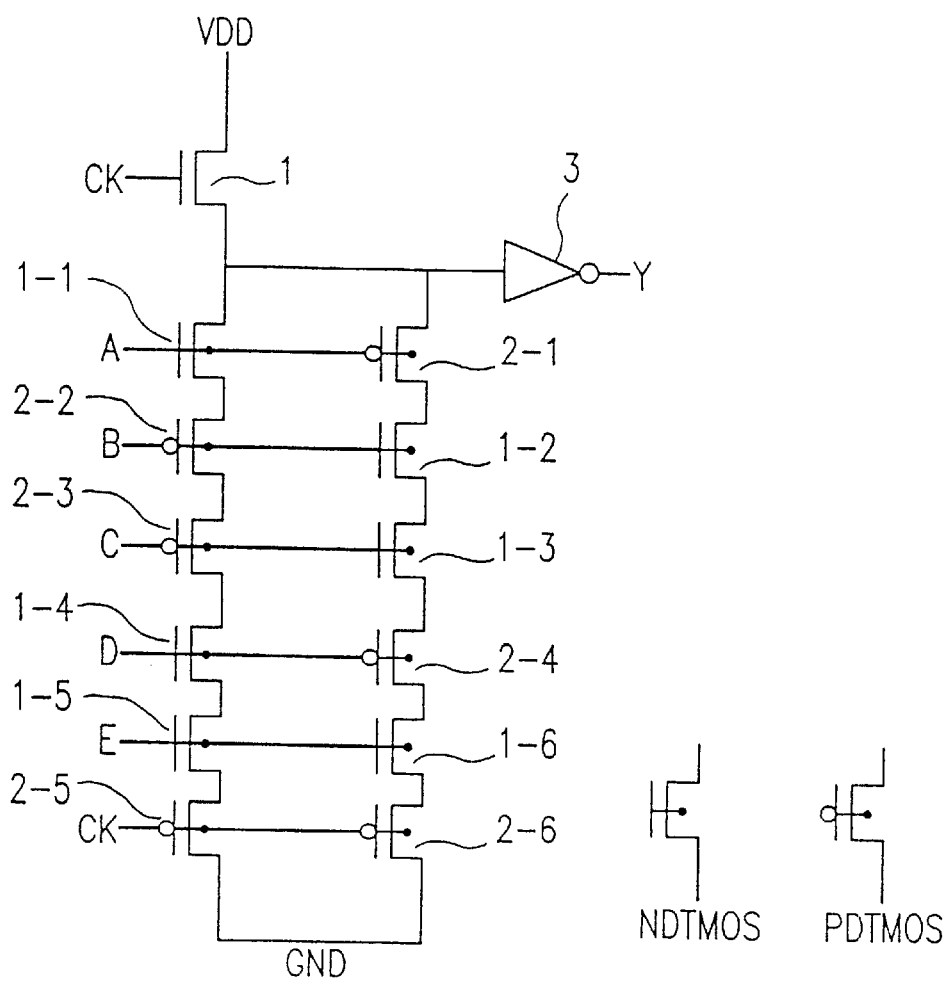
FIG. 5 is a circuit diagram showing a MOS logic circuit according to a fifth example of the present invention which has an improved configuration of a circuit mainly used as an instruction decoder.

FIG. 5 is a circuit diagram showing a MOS logic circuit according to a fifth example of the present invention which will be described as a circuit mainly used as an instruction decoder.

Figure 12:
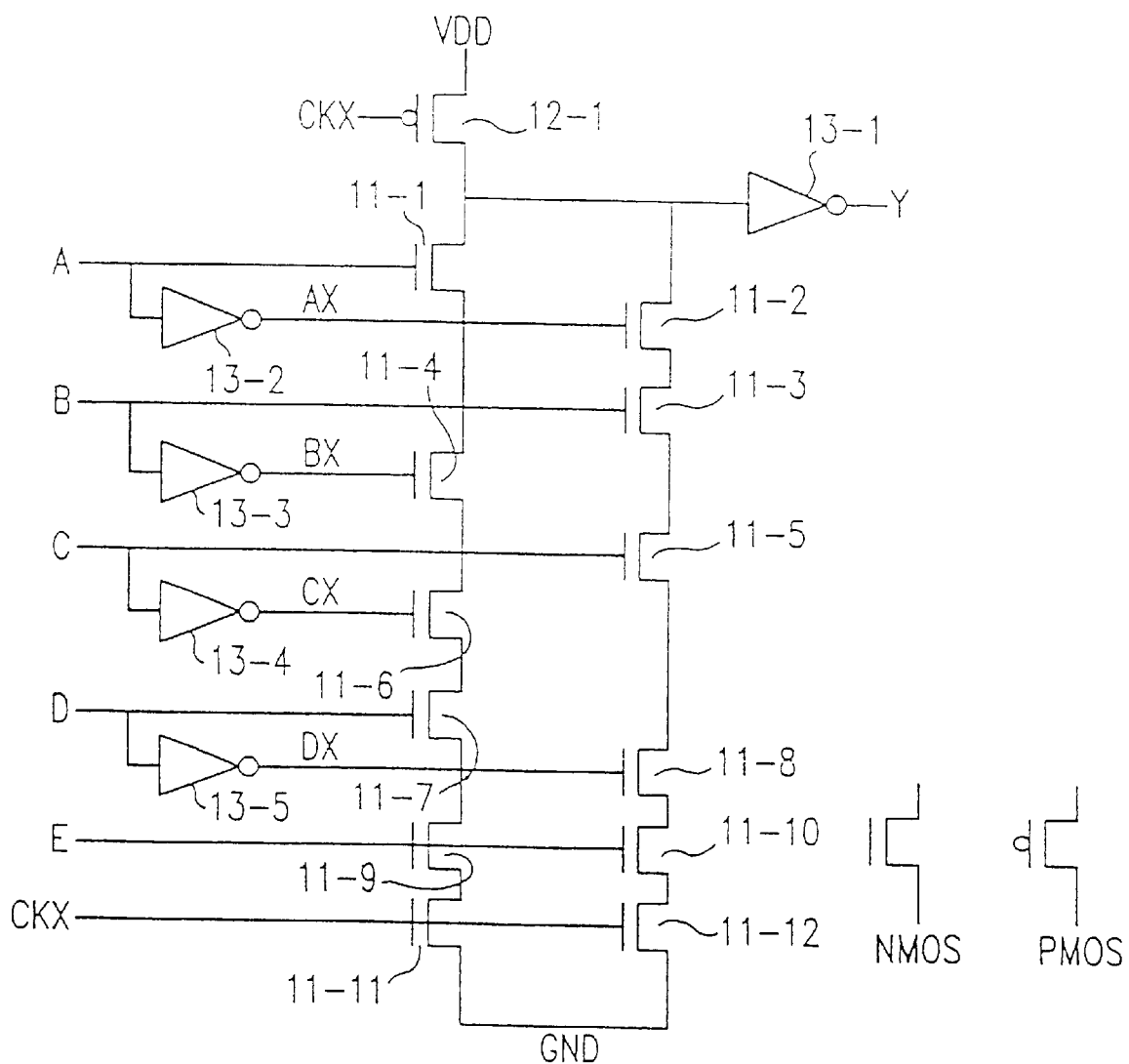
FIG. 12 is a circuit diagram showing a circuit mainly used as a conventional instruction decoder.

The MOS logic circuit according to the fifth example of the present invention includes NDTMOS transistors 1-1 to 1-6, PDTMOS transistors 2-1 to 2-6, an NDTMOS transistor 1 and an inverter 3. Advantages of the MOS logic circuit of the present example as shown in FIG. 5 will be explained by comparing it with the conventional instruction decoder as shown in FIG. 12. FIG. 12 is a circuit diagram showing a conventional circuit mainly used as an instruction decoder, which includes NMOS transistors 11-1 to 11-12, a PMOS transistor 12-1 and inverters 13-1 to 13-5. The inverters 13-2 to 13-5 generate inverted input signals AX, BX, CX and DX.

As can be appreciated from FIG. 5, the MOS logic circuit according to the fifth example of the present invention does not use any inverted signal. In other words, in the MOS logic circuit shown in FIG. 5, logic operations are performed by using only positive signals. Therefore, the amount of wiring gets less than that required in the conventional instruction decoder shown in FIG. 12. Moreover, the MOS logic circuit according to the fifth example of the present invention does not require a negative signal generator.

In addition, in the MOS logic circuit according to the fifth example of the present invention, a precharged voltage becomes VDD−Vthnon, where Vthnon is the threshold voltage of the NDTMOS transistor 1 when it is in the ON state. Even when the precharged charge is discharged according to a logic operation, the precharged charge is discharged merely to a level corresponding to 0−Vthpon, where Vthpon is the threshold voltage of each of the PDTMOS transistors 2-1 to 2-6 when they are in the ON state. Thus, only a small amount of charge is consumed.

Furthermore, according to the fifth example of the present invention, a stationary penetrating current is prevented from flowing through the inverter 3, which functions as an amplifier, by setting the threshold voltage of the inverter 3 to have a relationship with other threshold voltages such as described previously in connection with the first example of the present invention.

Figure 6:
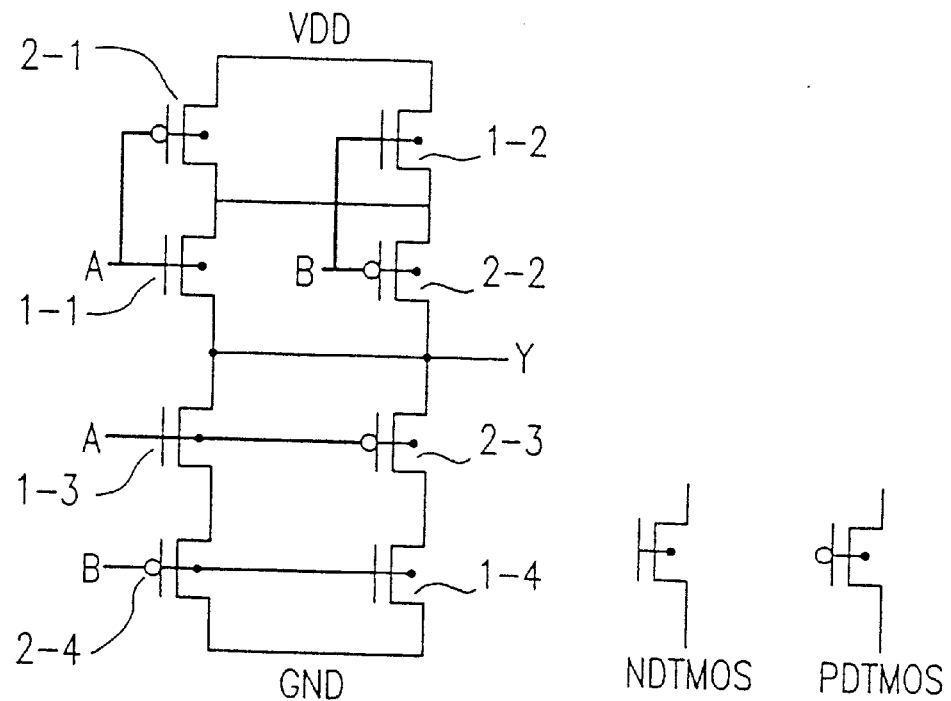
FIG. 6 is a circuit diagram showing a MOS logic circuit according to a sixth example of the present invention which has an improved configuration over the conventional circuits shown in FIG.s 10A and 10B.

FIG. 6 is a circuit diagram showing a MOS logic circuit according to a sixth example of the present invention.

Figure 10A:
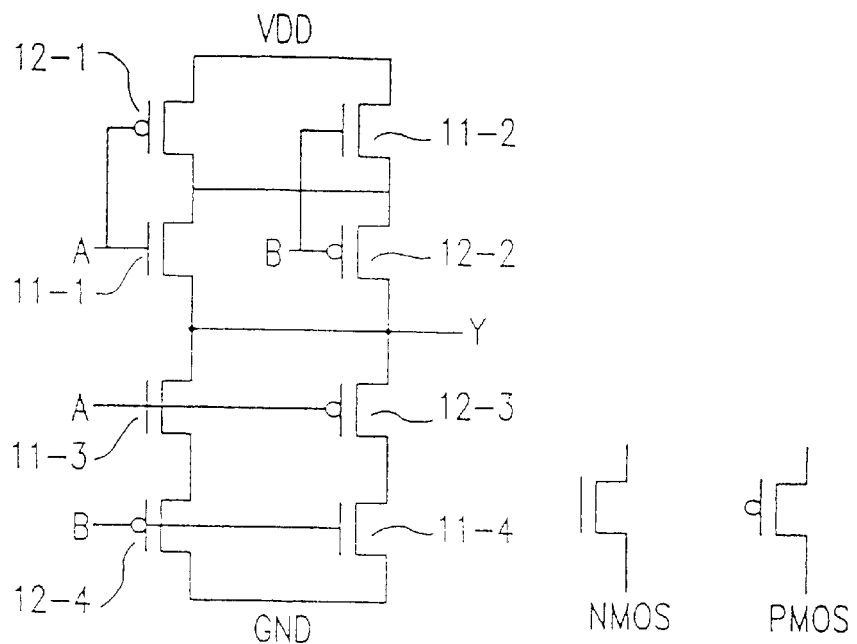
Figure 10B:
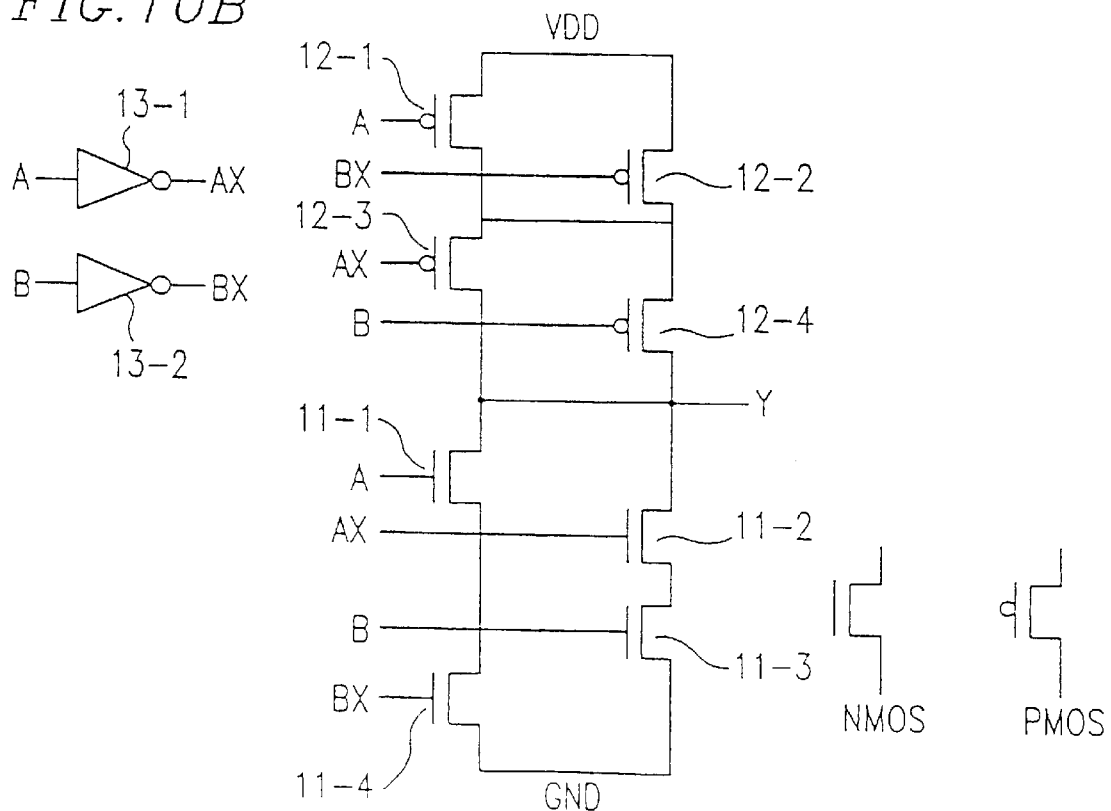
FIG. 10B is a circuit diagram showing a conventional logic circuit using inverted input signals.

The MOS logic circuit has an improved configuration as compared to the conventional logic circuits shown in FIGS. 10A and 10B, which perform the same overall logic operations. Specifically, the MOS logic circuit according to the sixth example of the present invention includes NDTMOS transistors 1-1 to 1-4 and PDTMOS transistors 2-1 to 2-4.

Hereinafter, advantages of the MOS logic circuit according to the sixth example of the present invention will be described by comparing it with the conventional logic circuits shown in FIGS. 10A and 10B.

As described above, the conventional CMOS circuit shown in FIG. 10A has the disadvantages of, for example, a stationary penetrating current flowing through an amplifier when an output level of the preceding circuit decreases. In the MOS logic circuit according to the sixth example of the present invention, however, such a stationary penetrating current is prevented from flowing by setting the threshold voltages of the DTMOS transistors, i.e., the NDTMOS transistors 1-1 to 1-4 and the PDTMOS transistors 2-1 to 2-4, in such a manner as described in connection with the first example of the present invention.

Moreover, since no inverted signal is required in the MOS logic circuit according to the sixth example of the present invention, the number of the signal lines is reduced compared to the conventional MOS logic circuit shown in FIG. 10B. Thus, the MOS logic circuit according to the sixth example of the present invention has a smaller wiring area and is operated with lower power consumption.

According to the sixth example of the present invention, various advantages (i.e., prevention of a stationary penetrating current, a reduction in a wiring area and power consumption) are realized at the same time which are conventionally difficult.

Figure 7:
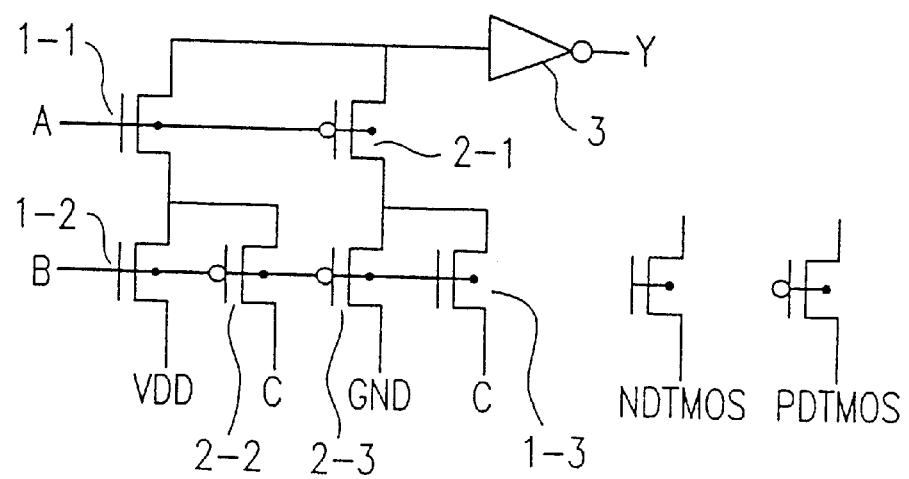
FIG. 7 is a circuit diagram showing a MOS logic circuit according to a seventh example of the present invention which has an improved configuration over the conventional circuit shown in FIG. 11.
Figure 8:
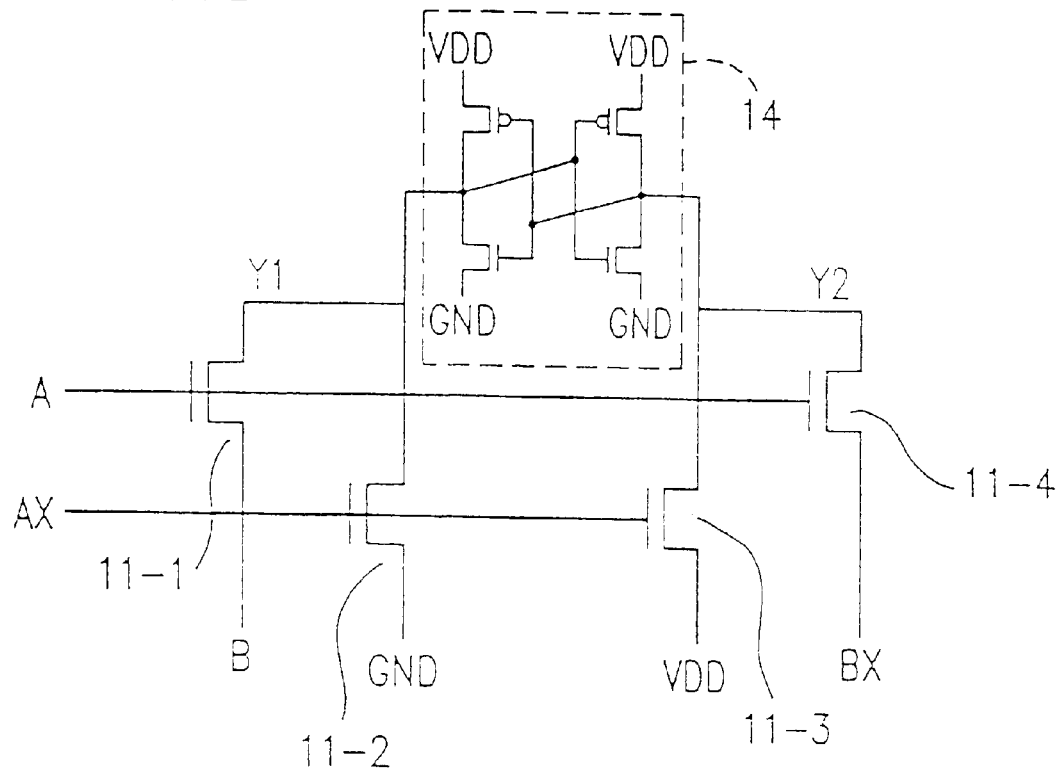
FIG. 8 is a circuit diagram showing an example of a conventional two-input AND (NAND) circuit.
Figure 9:
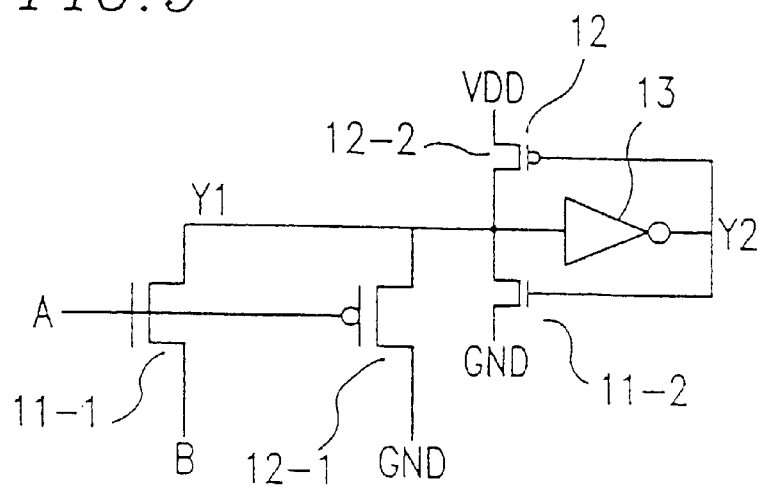
FIG. 9 is a circuit diagram showing a conventional logic circuit including a pass-transistor logic circuit made from NMOS and PMOS transistors.

FIG. 7 is a circuit diagram showing a MOS logic circuit according to a seventh example of the present invention.

Figure 11:
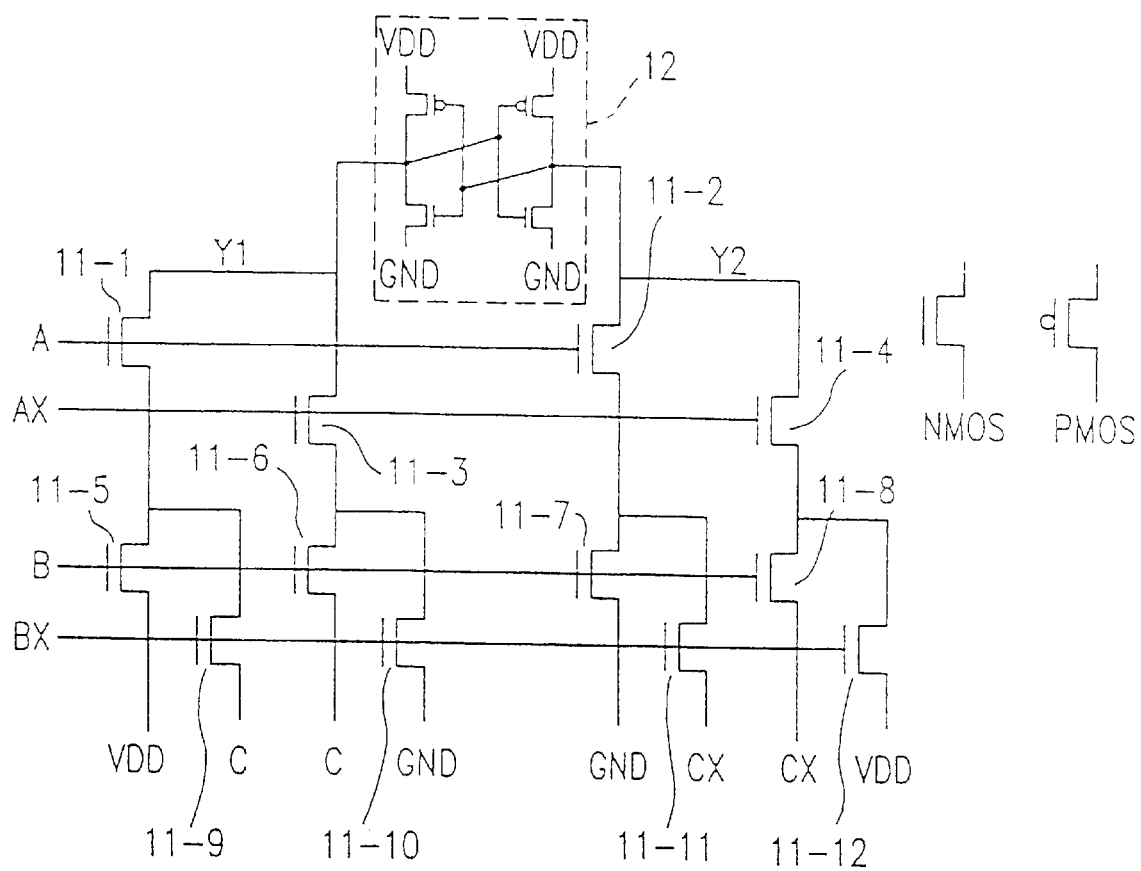
FIG. 11 is a circuit diagram showing a conventional logic circuit.

The MOS logic circuit of the present example has an improved configuration as compared to the conventional MOS logic circuit shown in FIG. 11, which performs the same overall logic operations. Specifically, the MOS logic circuit according to the seventh example includes NDTMOS transistors 1-1 to 1-3, PDTMOS transistors 2-1 to 2-3 and an inverter 3.

Hereinafter, advantages of the MOS logic circuit according to the seventh example of the present invention will be described by comparing it with the conventional MOS logic circuit shown in FIG. 11.

As described above, in the conventional circuit shown in FIG. 11, for example, when both of the input signals A and B are at the "H" levels, the NMOS pass-transistor is turned on so that the output of the VDD level is provided as the output Y1. However, when the threshold voltage of the NMOS pass-transistor is Vthn, the output Y1 is decreased by the NMOS pass-transistor to a level corresponding to VDD−Vthn. On the other hand, when the output of the GND level is provided as the output Y2, the PMOS transistor, whose gate is connected to the output Y2, of the CMOS latch 12 is turned on, while the NMOS transistor, whose gate is connected to the output Y2, of the CMOS latch 12 is turned off. As a result, the output Y1 is pulled up to the VDD level. However, when Vthn>|Vthp|, where Vthp is the threshold voltage of each of the PMOS transistors of the CMOS latch 12, both of the NMOS transistor and PMOS transistor, whose gates are connected to output Y1, of the CMOS latch 12 are in the ON state during a time period in which the output Y1 is pulled up to VDD–|Vthp|. This results in a penetrating current flowing between the VDD level and the GND level.

Moreover, in the conventional MOS logic circuit shown in FIG. 11, inverted signals AX, BX, CX and Y1 of the respective signals A, B, C and Y2 are necessary. As a result, the wiring area is large and a large amount of power is consumed due to the large number of signal alternations thereof. In addition, the large number of transistors results in a complicated circuit configuration, which in turn increases the fabrication cost.

In contrast, in the MOS logic circuit according to the seventh example of the present invention, no penetrating current flows through the circuit by setting the threshold voltages of the NDTMOS transistors 1-1 to 1-3 and the PDTMOS transistors 2-1 to 2-3 in such a manner as described previously in connection with the first example of the present invention.

Furthermore, according to the seventh example of the present invention, since no inverted signals for the signals A, B and Y are necessary, the number of transistors is smaller. Thus, a MOS logic circuit according to the seventh example of the present invention has a smaller circuit area, and is operated with a lower power consumption.

The present invention can also provide various semiconductor apparatuses each exhibiting the above-described advantages by incorporating therein any one of the above-described MOS logic circuits according to the present invention.

As described above, the MOS logic circuit in accordance with the present invention generally includes a pass-transistor logic circuit made from NDTMOS transistor(s) and/or PDTMOS transistor(s), and an amplifier for amplifying an output of the pass-transistor logic circuit to enhance a driving capability thereof. The NDTMOS transistor is used to perform a logic operation which is valid when a signal is at the "H" level while a PDTMOS transistor is used to perform a logic operation which is valid when a signal is at the "L" level. Accordingly, unlike a conventional logic circuit, a logic circuit is configured which requires no inverted signal. As a result, the number of signal lines is reduced, and thus, the wiring area is reduced. Furthermore, since no inverted signal is required, the number of signal alternation is also reduced. As a result, the amount of current required for charging and discharging the wiring capacitance is reduced, thereby realizing lower power consumption.

In the logic circuit according to the present invention, the amount of penetrating current which flows while both positive and negative signals are at the "H" levels is very small. This is because the above-described logic circuit is realized only by a positive signal, in which case a direct current path between the power source voltage level (the VDD level) and the GND level is blocked in the same manner as a CMOS static circuit. Therefore, pull-up and pull-down elements are not necessary, which is advantageous in that the number of elements is reduced and thus a circuit area is reduced.

In the pass-transistor logic circuit having the configuration of the present invention, both NDTMOS and PDTMOS transistors may be used as the pass-transistor logic circuit. Alternatively, a pass-transistor logic circuit according to the present invention may include only NDTMOS transistors with an inverted signal $\overline{A}$ being input to one of the NDTMOS transistors, or may include only PDTMOS transistors with an inverted signal $\overline{A}$ being input to one of the PDTMOS transistors. Both of such pass-transistor logic circuits have substantially the same logic function as the pass-transistor logic circuit including both NDTMOS and PDTMOS transistors, realizing the reduced numbers of elements and thus the reduced circuit areas, as well as capable of operating with lower power consumption.

Furthermore, according to another aspect of the present invention, a MOS logic circuit generally includes a pass-transistor logic circuit made from one or more MOS transistor and an amplifier made from one or more MOS transistor, where the absolute value of the threshold voltage of the MOS transistor included in the amplifier is greater than the absolute value of the threshold voltage of the MOS transistor included in the pass-transistor logic circuit. In such a configuration, a stationary penetrating current is prevented from flowing through the circuit even without providing any pull-up or pull-down element. Thus, a MOS logic circuit having the smaller number of elements and a smaller circuit area, which is operated with lower power consumption, is realized.

The MOS transistor to be used in the above may be an NMOS transistor, a PMOS transistor, or a complementary type MOS transistor including NMOS and PMOS transistors.

Furthermore, a MOS logic circuit according to the present invention may include a DTMOS transistor for a precharging operation, a determination circuit made from a DTMOS transistor for determining a logic based on whether a charge precharged according to an input signal is discharged or held, and an amplifier made from a DTMOS transistor for amplifying an output of the determination circuit. According to this configuration, the amount of precharged charge to be the n discharged in accordance with a logic is small, and thus, the amount of charge consumption is low. As a result, the MOS logic circuit operative with a reduced power consumption is provided.

Furthermore, according to the present invention, a PMOS transistor having a gate connected to a well may be used, in place of an NMOS transistor in a MOS logic circuit which requires an inverted signal to be input to a gate thereof, with a non-inverted signal being input to the gate of the PMOS transistor, and an NMOS transistor having a gate connected to a well may be used, in place of a PMOS transistor in a MOS logic circuit which requires an inverted signal to be input to a gate thereof, with a non-inverted signal being input to the gate of the NMOS transistor. Such a configuration allows a negative signal generator, which is conventionally required, to be eliminated. In addition, since a negative signal required in a conventional CMOS circuit is not necessary, the wiring area can be reduced. Moreover, the amount of current required for charging and discharging capacitances in accordance with signal alternations can be reduced, resulting in a reduced power consumption.

Moreover, in accordance with the present invention, various semiconductor apparatuses exhibiting the above-described advantages can be realized by incorporating therein the above-described MOS logic circuits.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A MOS logic circuit, comprising:

a pass-transistor logic circuit for performing a predetermined logic operation to provide an output, said pass-transistor logic circuit including a first DTMOS transistor having a threshold voltage; and an amplifying circuit for enhancing a driving capability of said output without employing a pull-up PMOS transistor, said amplifying circuit including a second DTMOS transistor having an absolute value of a threshold voltage higher than that of said first DTMOS transistor when said second DTMOS transistor is in an off state and said first DTMOS transistor is in an on state to prevent leakage of a stationary penetrating current through said amplifying circuit, thereby lowering power consumption of the MOS logic circuit, wherein each of said DTMOS transistors have a gate connected to an associated well in which a channel thereof is formed, said gate and associated well short-circuited to prevent an increase in threshold voltage due to a back gate effect, thereby reducing the number of pass-transistor and amplifier elements required in the MOS logic circuit.

2. A MOS logic circuit according to claim 1, wherein said first DTMOS transistor is an N-type DTMOS transistor.

3. A MOS logic circuit according to claim 1, wherein said first DTMOS transistor is a P-type DTMOS transistor.

4. A MOS logic circuit according to claim 1, wherein said first DTMOS transistor includes a first N-type DTMOS transistor and a first P-type DTMOS transistor, and said second DTMOS transistor includes a second N-type DTMOS transistor and a second P-type DTMOS transistor, and wherein said first N-type DTMOS transistor is employed in logic operations pertaining to a high level signal, and said first P-type DTMOS transistor is employed in logic operations pertaining to a low level signal.

5. A MOS logic circuit, comprising:

a first DTMOS transistor for performing a precharge operation to produce a charge;

a determination circuit for discharging or holding said charge of said first DTMOS transistor to determine a logic based on an input signal, said determination circuit including a second DTMOS transistor; and an amplifying circuit for amplifying an output from said determination circuit without employing a pull-up PMOS transistor, said amplifying circuit including a third DTMOS transistor, wherein each of said DTMOS transistors have a gate connected to an associated well in which a channel thereof is formed, said gate and associated well short-circuited to prevent an increase in threshold voltage due to a back gate effect, thereby reducing the number of pass-transistor and amplifier elements required in the MOS logic circuit; and wherein the logic circuit does not include any PMOS and NMOS transistors.

6. A semiconductor apparatus including the MOS logic circuit according to claim 1.

7. A semiconductor apparatus including the MOS logic circuit according to claim 5.

* * * * *